(12) United States Patent
Sano et al.

(10) Patent No.: US 12,069,387 B2
(45) Date of Patent: Aug. 20, 2024

(54) IMAGING APPARATUS AND ELECTRONIC EQUIPMENT

(71) Applicant: CANON KABUSHIKI KAISHA, Tokyo (JP)

(72) Inventors: Yasuhiko Sano, Kanagawa (JP); Wenying Ye, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 167 days.

(21) Appl. No.: 17/936,150

(22) Filed: Sep. 28, 2022

(65) Prior Publication Data

US 2023/0103993 A1 Apr. 6, 2023

(30) Foreign Application Priority Data

Oct. 1, 2021 (JP) ................................. 2021-163075

(51) Int. Cl.
*H04N 25/617* (2023.01)
*H01L 27/146* (2006.01)
*H04N 25/709* (2023.01)
*H04N 25/79* (2023.01)

(52) U.S. Cl.
CPC ..... *H04N 25/617* (2023.01); *H01L 27/14618* (2013.01); *H01L 27/14636* (2013.01); *H04N 25/709* (2023.01); *H04N 25/79* (2023.01)

(58) Field of Classification Search
CPC .... H04N 25/617; H04N 25/709; H04N 25/79; H01L 27/14618; H01L 27/14636
See application file for complete search history.

(56) References Cited

U.S. PATENT DOCUMENTS

| | | | |
|---|---|---|---|
| 8,743,207 B2 * | 6/2014 | Boulanger | H04N 5/33 348/164 |
| 9,093,363 B2 * | 7/2015 | Sukegawa | H01L 27/14636 |
| 10,598,936 B1 * | 3/2020 | Berkovich | G06F 3/011 |
| 10,692,916 B2 * | 6/2020 | Arima | H01L 27/14618 |
| 11,013,105 B2 | 5/2021 | Ye | |
| 11,749,701 B2 * | 9/2023 | Takada | H04N 23/54 348/308 |
| 11,887,839 B2 * | 1/2024 | Arima | H01L 23/4006 |

(Continued)

FOREIGN PATENT DOCUMENTS

| JP | 2003168791 A | 6/2003 |
|---|---|---|
| JP | 2017103517 A | 6/2017 |

*Primary Examiner* — Abdelaaziz Tissire
(74) *Attorney, Agent, or Firm* — VENABLE LLP

(57) ABSTRACT

An imaging apparatus includes: an imaging device in which photoelectric conversion elements are arranged in an array; a wiring component in which the imaging device is mounted and a power source wiring is provided; connection wirings that connects the power source wiring and the imaging device each other; at least two power supply sources connected to the power source wiring; and at least one power supply source connected to the power source wiring, the power supply sources supply power to the imaging device via the power source wiring and the connection wirings, at a horizontal synchronization frequency of the imaging device, the two power supply sources have lower impedances than the one power supply source, and at least one of the connection wirings is connected to a wiring path connecting the two power supply sources in the power source wiring.

22 Claims, 11 Drawing Sheets

(56) References Cited

U.S. PATENT DOCUMENTS

| | | | |
|---|---|---|---|
| 11,902,684 B2 * | 2/2024 | Shishido | H01L 27/14612 |
| 2012/0293698 A1 | 11/2012 | Sukegawa et al. | |
| 2015/0062367 A1 | 3/2015 | Inui | |
| 2016/0316162 A1 | 10/2016 | Kobayashi | |
| 2020/0084877 A1 | 3/2020 | Ye et al. | |
| 2021/0217795 A1 | 7/2021 | Takada et al. | |
| 2022/0116526 A1 | 4/2022 | Kawase | |
| 2023/0378224 A1 * | 11/2023 | Furuta | H01L 27/14636 |
| 2024/0145901 A1 * | 5/2024 | Igarashi | H01Q 1/2283 |

* cited by examiner

IMAGING APPARATUS AND ELECTRONIC EQUIPMENT

BACKGROUND OF THE INVENTION

Field of the Invention

The present invention relates to an imaging apparatus and an electronic equipment.

Description of the Related Art

An image capturing apparatus such as a digital camcorder, a digital still camera, or the like includes an imaging apparatus having an image sensor. In recent years, ISO (International Organization for Standardization) sensitivity in image sensors has been improved. As a result, a clearer image can be generated even when the image is taken in a scene with a small amount of light, such as when the image is taken in a night scene. In addition, higher continuous imaging speed makes it possible to image faster moving objects.

However, with the improvement of ISO sensitivity in the image sensor, sensitivity to weak magnetic field noise around the image sensor, which has not been a problem in the past, has also increased. As a result, the image sensor is affected by the magnetic field noise, and a problem that the image is disturbed has become apparent. In addition, current consumption increases due to the high-speed operation. Accordingly, a magnetic field is radiated from the power source wiring pattern of the imaging apparatus, and there is a problem that noise is generated in a part of the captured image by the influence of the magnetic field.

Japanese Patent Application Laid-Open No. 2017-103517 discloses a technique for reducing the influence of at least one of a magnetic field and an electric field generated by a current supplied from a power source to an electronic component on an electronic unit or the outside thereof.

In the technique of Japanese Patent Application Laid-Open No. 2017-103517, there is insufficient consideration for reducing image noise.

It is an object of the present invention to provide an advantageous technique for reducing image noise in an imaging apparatus and an electronic equipment.

SUMMARY OF THE INVENTION

According to an aspect of the present invention, there is provided an imaging apparatus including: an imaging device in which a plurality of photoelectric conversion elements are arranged in an array; a wiring component in which the imaging device is mounted and a power source wiring is provided; a plurality of connection wirings that connects the power source wiring and the imaging device each other; at least two power supply sources connected to the power source wiring; and at least one power supply source connected to the power source wiring, wherein the two power supply sources and the one power supply source supply power to the imaging device via the power source wiring and the plurality of connection wirings, wherein, at a horizontal synchronization frequency of the imaging device, the two power supply sources have lower impedances than the one power supply source, and wherein at least one connection wiring of the plurality of connection wirings is connected to a wiring path connecting the two power supply sources in the power source wiring.

Further features of the present invention will become apparent from the following description of exemplary embodiments with reference to the attached drawings.

DESCRIPTION OF THE EMBODIMENTS

Embodiments of the present invention will now be described in detail with reference to the drawings.

First Embodiment

Figure 1:
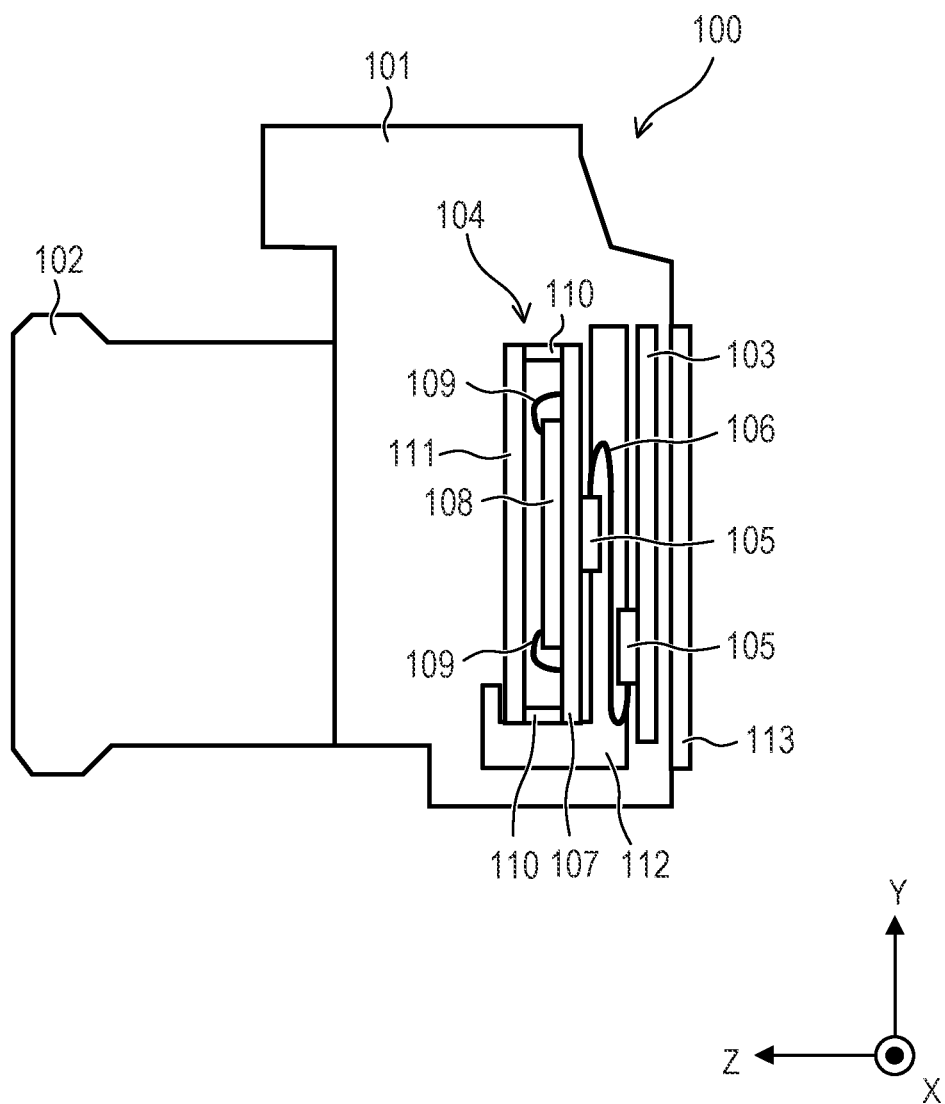
FIG. 1 is an explanatory diagram illustrating an image capturing apparatus as an example of an electronic equipment according to a first embodiment.

FIG. 1 is an explanatory diagram illustrating an electronic equipment 100 according to a first embodiment. The electronic equipment 100 is a digital camera such as a digital still camera or a digital camcorder, or the like, and in the example of FIG. 1, the electronic equipment 100 is a digital single-lens camera. The electronic equipment 100 includes a main body 101 and an interchangeable lens 102 which is a lens device that can be attached to and detached from the main body 101. The electronic equipment 100 may be an information terminal with a camera such as a smartphone, a personal computer, or the like.

The main body 101 includes an image processing substrate 103 on which an image processing semiconductor or the like is mounted, and an imaging apparatus 104 capable of imaging visible light incident from the interchangeable lens 102. The main body 101 includes an image stabilization unit 112 and a display 113.

The image processing substrate 103 is connected to the imaging apparatus 104 via a connector 105 and a flexible cable 106. The flexible cable 106 supplies power from the image processing substrate 103 to the imaging apparatus 104 and transmits signals such as image data output from the imaging apparatus 104 to the image processing substrate 103. The image processing substrate 103 functions as a processing apparatus that processes signals such as image data and the like output from the imaging apparatus 104. The image stabilization unit 112 is a driving device that moves the imaging apparatus 104, and moves the imaging apparatus 104 during imaging to reduce or prevent deterioration of image quality due to camera shake. The display 113 is a display device that displays an image based on the image data processed by the imaging apparatus 104. A battery (not illustrated) is arranged inside the main body 101, and power is supplied from the battery to the image processing substrate 103, the imaging apparatus 104, the interchangeable lens 102, the image stabilization unit 112, and the display 113.

Figure 2:
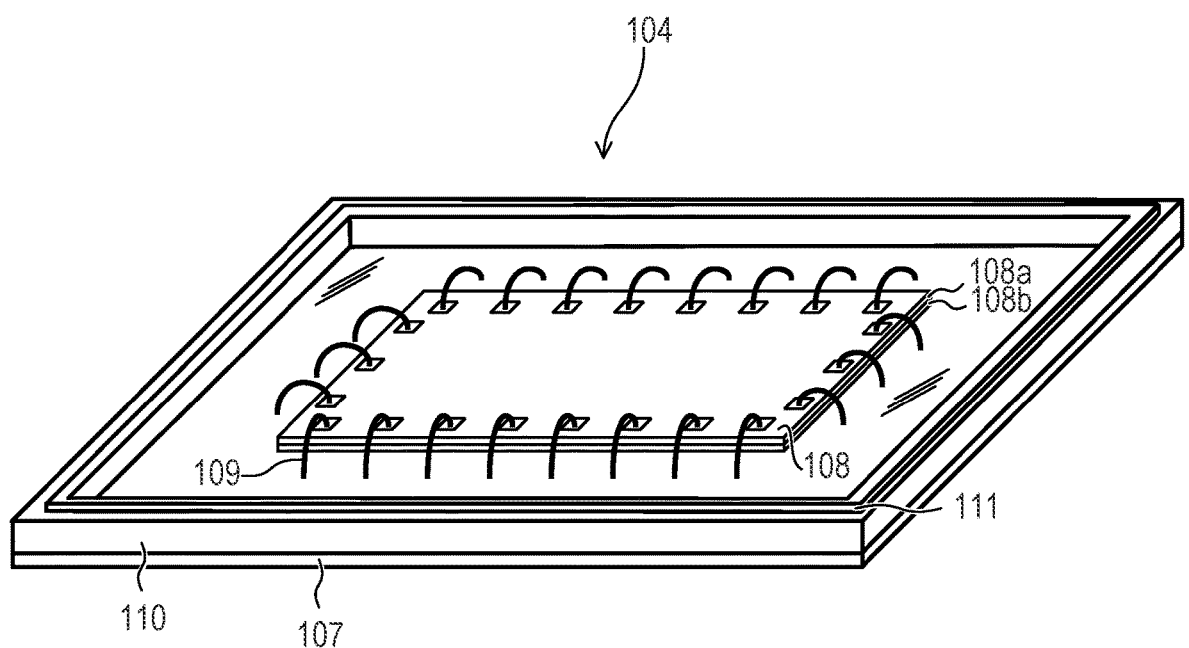
FIG. 2 is an explanatory diagram illustrating an imaging apparatus according to the first embodiment.

FIG. 2 is a perspective view of the imaging apparatus 104 according to the first embodiment. The imaging apparatus 104 includes a printed wiring board 107, an imaging device 108 having a photoelectric conversion element, connection wiring 109, a frame body 110, and a cover glass 111.

The printed wiring board 107 is connected to the imaging device 108 having the photoelectric conversion element through a plurality of connection wirings 109. The printed wiring board 107 is a wiring component that supplies power and control signals to the imaging device 108 and transfers digital data after photoelectric conversion from the imaging device 108. The connection wiring 109 is not particularly limited, but is generally a bonding wire made of gold, aluminum, or the like. The connection wiring 109 may be a solder bump. In place of the printed wiring board 107, a wiring component such as a ceramic package or the like may be used. The number of connection wirings 109 is not particularly limited, but is, for example, 12 or more.

The imaging device 108 is mounted on the printed wiring board 107. The imaging device 108 may be mounted in a packaged form. The imaging device 108 includes a pixel chip 108a having a photodiode and the like, which will be described later, and a circuit chip 108b having a preamplifier and a comparator, which will be described later, and have a stacked structure in which the pixel chip 108a and the circuit chip are electrically connected to each other. For example, the imaging device 108 is a stacked image sensor that includes a first semiconductor layer having a plurality of photoelectric conversion elements, a second semiconductor layer stacked over the first semiconductor layer and having an integrated circuit, and a wiring layer positioned between the first semiconductor layer and the second semiconductor layer. Note that, in the present embodiment, the imaging device 108 is not limited to this, and may be an imaging device in which the pixel chip 108a and the circuit chip 108b are formed on the same semiconductor.

The imaging device 108 is sealed with a frame body 110 molded of resin or the like and bonded to the printed wiring board 107 with an adhesive or the like, and a cover glass 111 bonded to the opposite side of the frame body 110 from the printed wiring board 107 with an adhesive or the like.

The imaging device 108 is, for example, a CMOS (Complementary Metal Oxide Semiconductor) image sensor or a CCD (Charge-Coupled Device) image sensor. The area of the imaging region of the imaging device 108 is not particularly limited, but is, for example, 200 mm$^2$ or larger (the size of micro four thirds or larger), 300 mm$^2$ or larger (the size of APS-C or larger), and 800 mm$^2$ or larger (the size of full size or larger).

Figure 3:
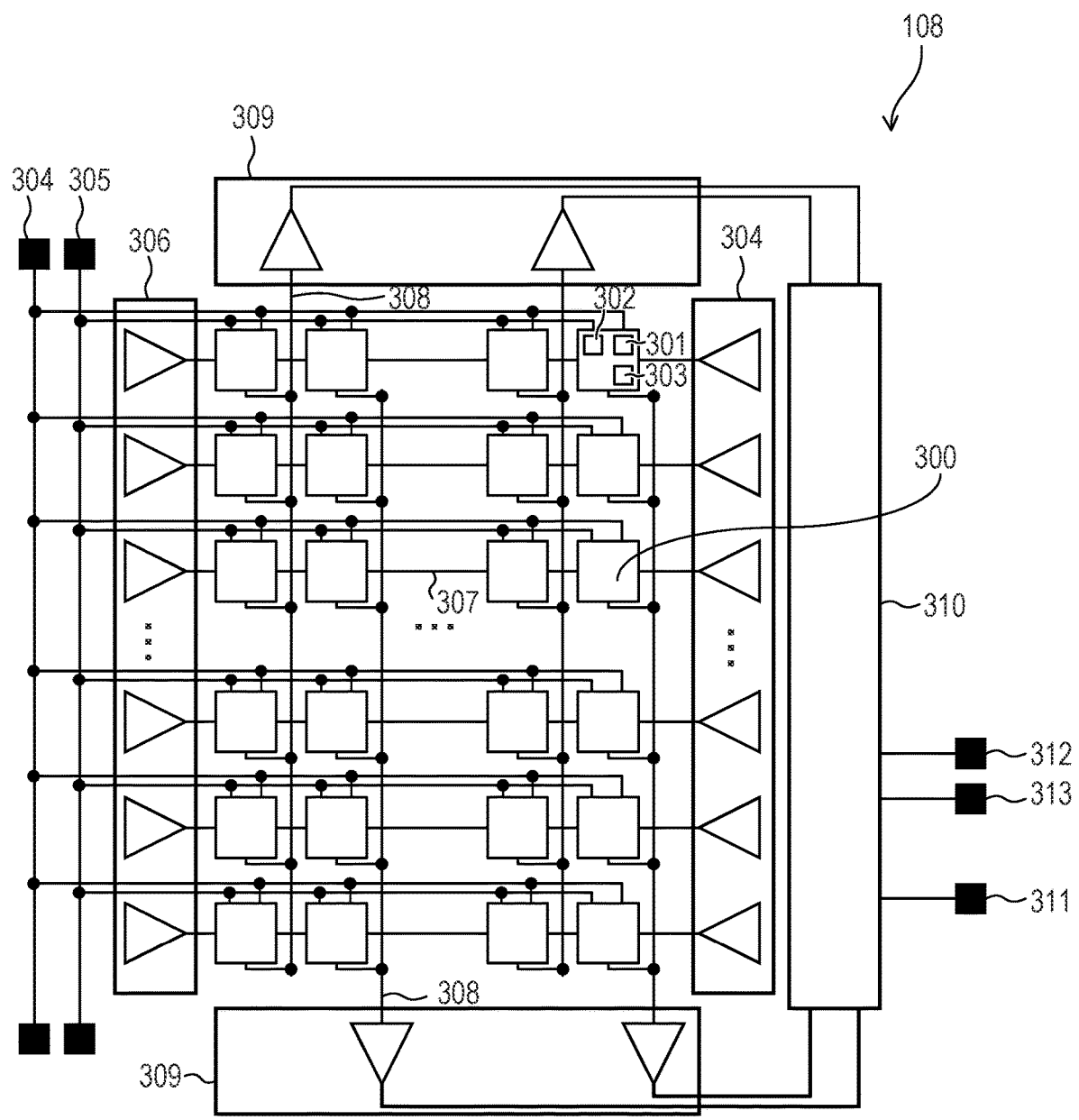
FIG. 3 is an explanatory diagram illustrating a circuit block of the imaging apparatus according to the first embodiment.

FIG. 3 is a circuit block diagram illustrating the configuration of the imaging device 108 according to the first embodiment. The imaging device 108 has a structure in which a plurality of pixels 300 are arranged in a grid shape. Note that the plurality of pixels 300 may be arranged in an array. Each pixel 300 comprises a photodiode 301, which is an example of a photodetector that performs photoelectric conversion, a floating diffusion (FD) capacitive element 302 that accumulates charge, and a transistor 303 that controls charge transfer. An analog power source 304 and an analog ground 305 are connected to each pixel 300 from a printed wiring board 107 through connection wirings 109. These connection wirings 109 serve as a path for current supply related to the imaging operation and a path of the return current.

The imaging device 108 includes a plurality of drivers 306, row selection lines 307, readout lines 308, a plurality of readout circuits 309, and a digital circuit 310. The plurality of drivers 306 select a pixel 300 for extracting the photoelectrically converted charge via a row selection line 307. Each of the plurality of readout circuits 309 includes a preamplifier that amplifies a signal which is photoelectrically converted by the pixel 300 and read through the readout line 308, and a comparator that converts the signal into a digital signal. The digital circuit 310 digitally processes the read signal and transmits the image signal from the digital signal output 311 to the image processing substrate 103. Note that a differential signal is used to transmit the image signal in general. A digital power source 312 and a digital ground 313 are connected to the digital circuit 310 from the printed wiring board 107 through connection wirings 109. These connection wirings 109 serve as a path for current supply related to the digital signal processing and a path of the return current.

Figure 4A:
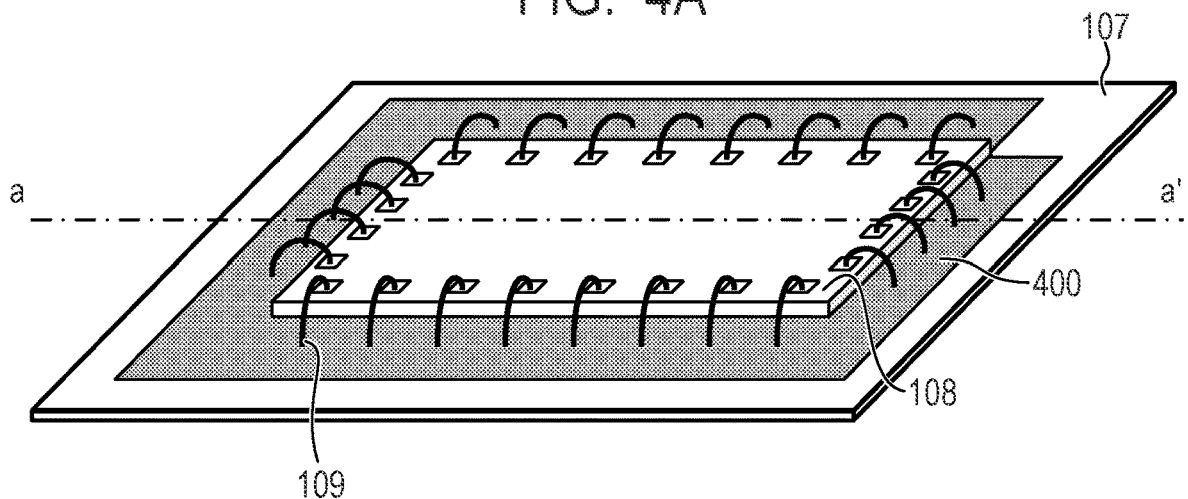
FIG. 4A is an explanatory diagram illustrating an arrangement of first power supply sources according to the first embodiment.
Figure 4B:
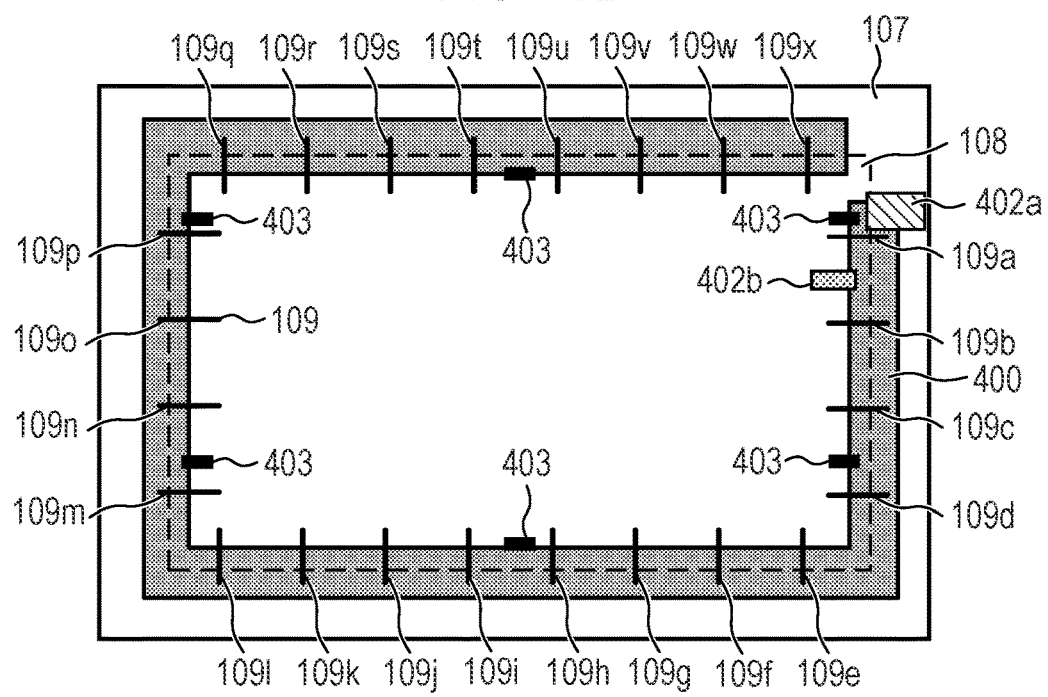
FIG. 4B is an explanatory diagram illustrating the arrangement of the first power supply sources according to the first embodiment.
Figure 4C:
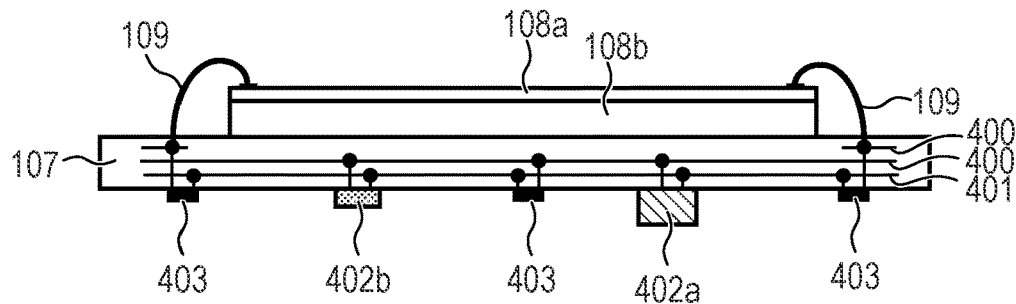
FIG. 4C is an explanatory diagram illustrating the arrangement of the first power supply sources according to the first embodiment.

FIGS. 4A to 4C are schematic diagrams illustrating power supply sources that supply power to a power source wiring 400 and the imaging device 108 in the imaging apparatus 104 according to the first embodiment. FIG. 4A illustrates a perspective view, FIG. 4B illustrates a top view and FIG. 4C illustrates a cross-sectional view along an a-a' line in FIG. 4A.

As illustrated in FIGS. 4A to 4C, the imaging apparatus 104 includes a power source wiring 400, a ground wiring 401, first power supply sources 402a and 402b, second power supply sources 403, and a plurality of connection wirings 109a to 109x as the connection wirings 109. Note that, in FIG. 4B and FIGS. 5B, 7A, 8A, 9A, 11A and 12A which will be described later, the positional relationships between the members in the direction perpendicular to the plate surface of the printed wiring board 107 are appropriately ignored for the purpose of clarity. Note also that, in FIG. 4 C and FIG. 5C which will be described later, the positions of the members in the direction parallel to the plate surface of the printed wiring board 107 are appropriately changed for clarity.

The power source wiring 400 is formed of a conductor, such as copper or the like, on the printed wiring board 107. The power source wiring 400 is formed, for example, at the peripheral edge of the printed wiring board 107. Specifically, the power source wiring 400 is formed to have a non-closed loop shape along each of the four sides of the quadrilateral imaging device 108. The plurality of connection wirings 109a to 109x connect the power source wiring 400 and the imaging device 108 to each other.

The power source wiring 400 functions as a path for supplying power to the imaging device 108 via the plurality of connection wirings 109a to 109x. The plurality of connection wirings 109a to 109x connecting the power source wiring 400 and the imaging device 108 are arranged at predetermined intervals along the power source wiring 400 having, for example, a non-closed loop shape. Note that the power source wiring 400 may be composed of only one layer of the printed wiring board 107, or may be composed of a plurality of layers as illustrated in FIG. 4C, in which the plurality of layers are connected by vias provided therebetween.

From the viewpoint of reducing the influence on imaging by the imaging device 108, it is preferable that the power source wiring 400 is formed so as not to overlap an area of 90% or more of the imaging region of the imaging device 108.

The ground wiring 401 is formed of a conductor, such as copper or the like, on the printed wiring board 107. The ground wiring 401 functions as a return path of the current supplied from the power source wiring 400 to the imaging device 108, and is connected to the imaging device 108 via the plurality of connection wirings 109a to 109x in the same manner as the power source wiring 400.

The plurality of first power supply sources 402a and 402b provide power to the imaging device 108 via the power source wiring 400 and the plurality of connection wirings 109a to 109x. The first power supply sources 402a and 402b include, for example, a power source IC (Integrated Circuit) mounted on the printed wiring board 107, a power source IC mounted on the image processing substrate 103 via the connector 105, a capacitor, or the like. The capacitors as the first power supply sources 402a and 402b are, for example, capacitors having the same standard capacitance values as each other. Note that the capacitance value is expressed by a standard number±tolerance, and the standard capacitance value is this standard number. The capacitance values of the capacitors as the first power supply sources 402a and 402b need only to be the same in standard number and may be different within the tolerances. If the standard capacitance values of the two capacitors are the same as each other, it can be said that the capacitance values of the two capacitors are substantially the same as each other. The power source IC is, for example, a linear regulator or a switching regulator, for example, an LDO (Low Dropout) regulator or a DC/DC converter. The first power supply sources 402a and 402b may be, for example, a combination of an integrated circuit and a capacitor, one of which may be an integrated circuit and the other of which may be a capacitor. One of the first power supply sources 402a and 402b may be a regulator. Note that the number of the first power supply sources is not limited to two, but may be six or more for the twelve or more connection wirings 109, for example.

The second power supply sources 403 are similarly arranged on at least one of the printed wiring board 107 and the image processing substrate 103 to supply power to the imaging device 108 via the power source wiring 400 and the plurality of connection wirings 109a to 109x. The second power supply source 403 is, for example, a ceramic capacitor having a relatively small capacity or the like.

Note that, although FIG. 4B illustrates a case where the two first power supply sources 402a and 402b and the six second power supply sources 403 are mounted on the printed wiring board 107, the present invention is not limited thereto. At least two first power supply sources and at least one second power supply source may be mounted on the printed wiring board 107.

The difference between the first power supply sources 402a and 402b and the second power supply sources 403 is their impedance. The frequency of the current flowing through the power source wiring 400 is substantially synchronized with the frequency at which the imaging device 108 operates, and generally becomes a horizontal synchronization frequency (about 20 kHz to 200 kHz). The frequency of the current flowing through the power source wiring 400 varies depending on the imaging mode. The current component in this frequency band causes image noise. The plurality of second power supply sources 403 are provided on the printed wiring board 107 to supply power to the imaging device 108, typically in the order of MHz or more, and are arranged near the imaging device 108, that is, near the connection wirings 109. Since the impedance of the second power supply sources 403 is higher than that of the first power supply sources 402a and 402b in the frequency band of the horizontal synchronization frequency at issue here, the second power supply sources 403 cannot be substantial power supply sources in this frequency band. On the other hand, the first power supply sources 402a and 402b are selected to have lower impedance than the second power supply sources 403 in the horizontal synchronous frequency band. Therefore, in the horizontal synchronizing frequency band, only the plurality of first power supply sources 402a and 402b among these power supply sources can supply power to the imaging device 108. Specifically, the first power supply sources 402a and 402b may have an impedance of less than 10 [Ω] at the horizontal synchronization frequency described above. Note that the impedance of the first power supply sources 402a and 402b at the horizontal synchronization frequency may be 5 [Ω] or less or 1 [Ω] or less, or 1 [mΩ] or more or 5 [mΩ] or more. Also note that the impedance ratio of each of the plurality of first power supply sources 402a and 402b is preferably five times or less.

Each of the first power supply sources 402a and 402b and the second power supply sources 403 described above is not composed of only a resistance component, but includes at least one of a capacitive component and an inductive component. Therefore, the impedances of the first power supply sources 402a and 402b and the second power supply sources 403 have frequency dependence, respectively.

A mechanism for generating image noise will be described below. When the imaging device 108 starts the imaging operation, a current with a cycle corresponding to the horizontal synchronization frequency flows through each of the connection wiring 109a to 109x to supply power to the imaging device 108. At this time, the sum of the currents flowing through the connection wirings 109a to 109x flows through the power source wiring 400. When a current flows through the power source wiring 400, a radiation magnetic field according to the law of a right screw is generated around the power source wiring 400, and when this radiation magnetic field crosses a closed circuit formed by the wiring (such as the readout line 308, the row select line 307, and the like) in the imaging device 108, an induced electromotive force is generated. This induced electromotive force is superimposed on the desired signal voltage that have been photoelectrically converted, and the readout circuit 309 detects this signal to generate image noise. The image noise generated at this time increases as the intensity of the generated magnetic field increases. Therefore, it is known in FIGS. 4A to 4C that image noise locally increases in the vicinity of the power source wiring 400.

Next, the image noise reduction effect in the first embodiment will be described in accordance with the above-described mechanism for generating image noise by comparing FIGS. 4A to 4C, which illustrate the first embodiment, with FIGS. 5A to 5C, which illustrate a comparative example. In the first embodiment, there are twenty-four connection wirings 109a to 109x and two first power supply sources 402a and 402b.

First, FIGS. 5A to 5C, which illustrate the comparative example, will be explained. Note that the same components as those in FIGS. 4A to 4C are denoted by the same reference numerals. In addition, in order to simplify the description herein, the amount of current supplied to the imaging device 108 from each of the plurality of connection wirings 109a to 109x is assumed to be equal to Io [A]. Furthermore, the impedances of the first power supply sources 402a and 402b at the horizontal synchronization frequency is assumed to be equal.

Figure 5A:
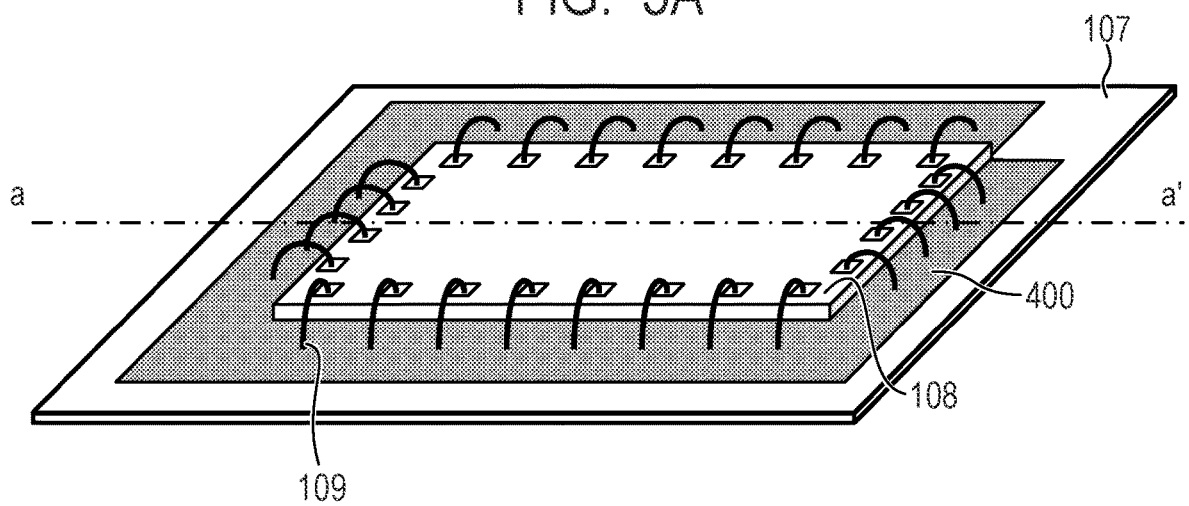
FIG. 5A is an explanatory diagram illustrating an arrangement of the first power supply sources according to a comparative example.
Figure 5B:
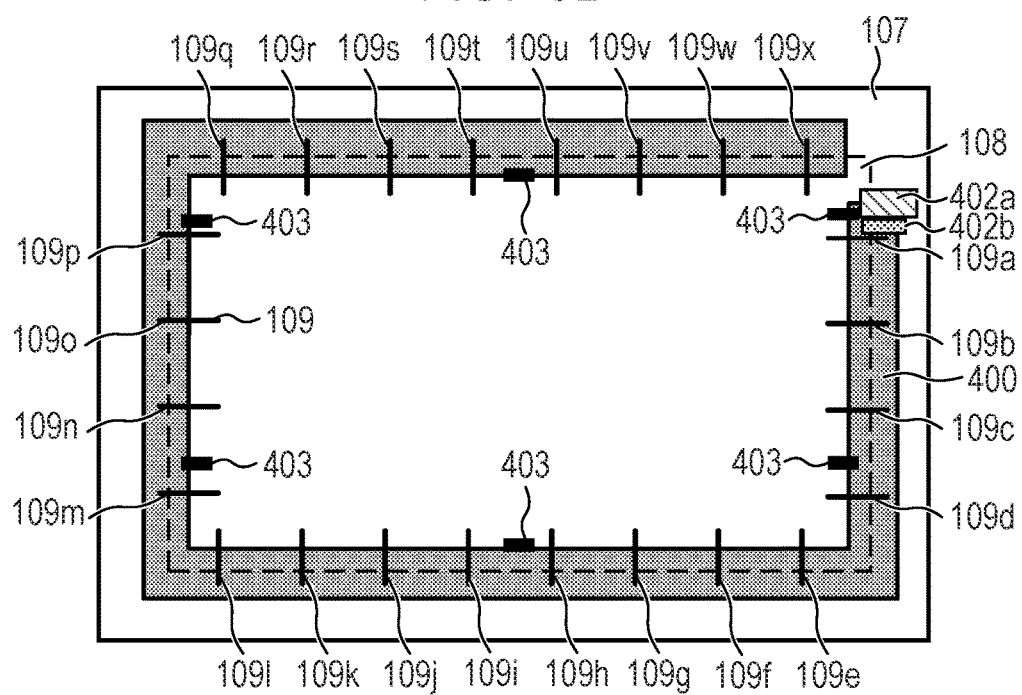
FIG. 5B is an explanatory diagram illustrating the arrangement of the first power supply sources according to the comparative example.
Figure 5C:
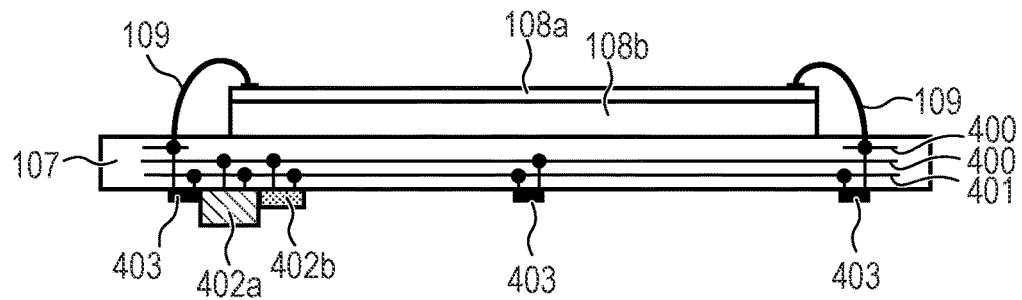
FIG. 5C is an explanatory diagram illustrating the arrangement of the first power supply sources according to the comparative example.

In FIGS. 5A to 5C, the first power supply sources 402a and 402b are both mounted at substantially the same position on the end of the power source wiring 400. In this case, all the currents supplied to the connection wirings 109a to 109x flow to the first power supply sources 402a and 402b. For example, a current Io [A] to be supplied to the connection wiring 109x flows in the power source wiring 400 between the connection wiring 109w and the connection wiring 109x. Next, 2Io [A], which is the sum of the currents supplied to the connection wiring 109w and the connection wiring 109x, flows between the connection wiring 109v and the connection wiring 109w. When this is repeated, a current of 24Io [A] corresponding to 24 lines from the connection wiring 109a to the connection wiring 109x flows in the power source wiring 400 between the first power supply sources 402a and 402b and the connection wiring 109a. Therefore, a magnetic field corresponding to this current amount is generated, and image noise corresponding to the strength of the magnetic field is generated.

Next, FIGS. 4A to 4C of the first embodiment will be described. The difference between FIGS. 4A to 4C of the first embodiment and FIGS. 5A to 5C of the comparative example is that one connection wiring 109a is arranged between the first power supply source 402a and the first power supply source 402b in FIGS. 4A to 4C. That is, in the present embodiment, one connection wiring 109a is connected to a wiring path connecting the first power supply source 402a and the first power supply source 402b in the power source wiring 400. Thus, the magnetic field generated by the load current can be reduced by dispersing the current flowing through the power source wiring 400. Note that at least one connection wiring 109 may be connected to a wiring path connecting the first power supply source 402a and the first power supply source 402b in the power source wiring 400. In the following description, when Z is arranged between X and Y, it means that Z is arranged in a path from X to Y (or from Y to X), and in this case, the path is not limited to a linear path connecting X and Y, but may be a wiring path (electrical path) connecting X and Y.

In FIGS. 4A to 4C, since the impedances of the first power supply sources 402a and 402b are the same, the current supplied to the respective connection wirings 109a to 109x is supplied from each of 0.5 Io [A]. The sum of these currents flows through the power source wiring 400, and this current is determined as follows by the superposition principle in electric circuits.

In the power source wiring 400 between the first power supply source 402a and the connection wiring 109a, a current of 24×0.5Io [A]=12Io [A] flows.

Next, the current flowing between the first power supply source 402b and the connection wiring 109a is considered. Between them, a current 23×0.5Io [A]=11.5Io [A] supplied from the first power supply source 402a to the connection wirings 109b to 109x flows. On the other hand, a current supplied from the first power supply source 402b to the connection wiring 109a flows as much as 1×0.5Io=0.5Io [A] between them, which is opposite to 11.5Io [A] supplied from the first power supply source 402a. Consequently, the current flowing between the first power supply source 402b and the connection wiring 109a becomes (11.5−0.5)Io [A]=11Io [A].

Next, the current flowing between the first power supply source 402b and the connection wiring 109b is considered in the same manner as before. Between them, a current 23×0.5Io [A]=11.5Io [A] supplied from the first power supply source 402a to the connection wirings 109b to 109x flows. On the other hand, a current 23×0.5Io=11.5Io [A] supplied from the first power supply source 402b to the connection wirings 109a to 109b flows between them. Since the directions of these currents are the same, the current flowing between the first power supply source 402b and the connection wiring 109b is (11.5+11.5)Io [A]=23Io [A].

Thereafter, the current flowing between each of the connection wirings is calculated in the same manner as the current flowing between the first power supply source 402b and the connection wiring 109b.

Figure 6:
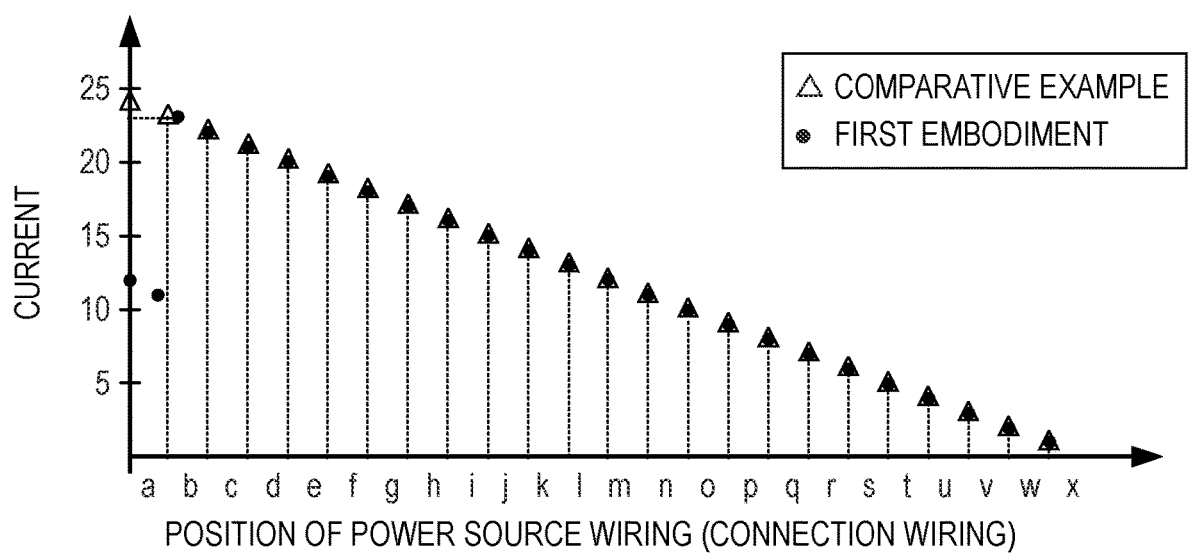
FIG. 6 is an explanatory diagram comparing the amounts of currents flowing through the power source wirings in the first embodiment and in the comparative example.

FIG. 6 is a plot of the magnitude of the current flowing through the respective portions of the power source wiring 400, which is described with reference to the first embodiment in FIGS. 4A to 4C and the comparative example in FIGS. 5A to 5C. The alphabets on the horizontal axis are illustrated by taking out only the subscripts of the connection wirings 109a to 109x in FIGS. 4A to 4C and FIGS. 5A to 5C. The value on the vertical axis is obtained by dividing the value of the current by Io. As can be seen from this, the current flowing at a maximum of 24Io [A] in the comparative example is reduced to 23Io [A] in the first embodiment. Therefore, the amount of image noise generated by the magnetic field caused by the current can be reduced.

Thus, according to the present embodiment, in the imaging apparatus 104, it is possible to reduce image noise caused by the radiation magnetic field generated from the pattern of the power source wiring 400.

Second Embodiment

Figure 7A:
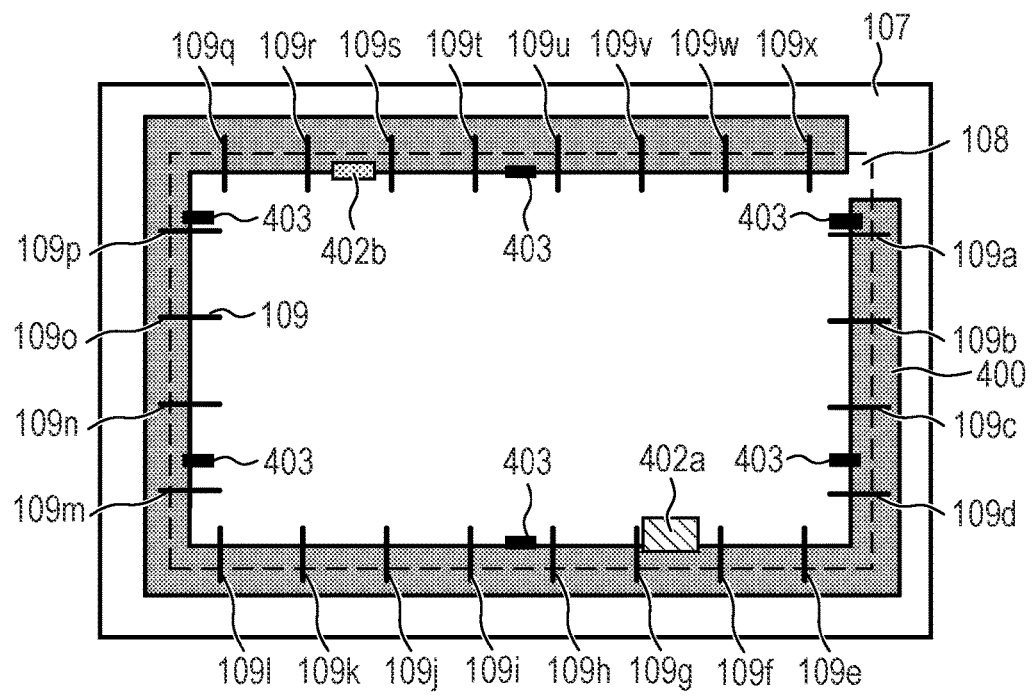
FIG. 7A is an explanatory diagram illustrating an arrangement of first power supply sources according to a second embodiment.

FIG. 7A is a top view illustrating the power supply sources that supply power to the power source wiring 400 and the imaging device 108 of the imaging apparatus according to a second embodiment. FIG. 7A illustrates the first power supply source 402a arranged between the connection wiring 109f and the connection wiring 109g, and the first power supply source 402b arranged between the connection wiring 109r and the connection wiring 109s. In this case, the same discussion as in the first embodiment will be made.

The power source wiring 400 between the first power supply source 402a and the connection wiring 109f is considered. A current supplied from the first power supply source 402a is a current 6×0.5Io=3 Io [A], which is half of a current for six lines from the connection wiring 109a to the connection wiring 109f. Next, a current supplied from the first power supply source 402b similarly becomes 6×0.5Io=3 [A], which is half of the current for six lines from the connection wiring 109a to the connection wiring 109f. As a result, 6Io [A], which is the sum of these currents, flows through the power source wiring 400 between the first power supply source 402a and the connection wiring 109f.

A current of 6Io [A] flows through the power source wiring 400 between the first power supply source 402b and the connection wiring 109s by the same discussion.

Next, the power source wiring 400 between the first power supply source 402a and the connection wiring 109g is considered. First, between them, 9Io [A], which is half of a current for eighteen lines from the connection wiring 109g to the connection wiring 109x, flows by the first power supply source 402a. Next, between them, 3Io [A], which is half of a current for six lines from the connection wiring 109a to the connection wiring 109f, flows by the first power supply source 402b. Since these currents have opposite directions, a current of (9−3)Io=6Io [A] flows in the power source wiring 400 between the first power supply source 402a and the connection wiring 109g. Similarly, a current of 6Io [A] also flows in the power source wiring 400 between the first power supply source 402b and the connection wiring 109r.

Figure 7B:
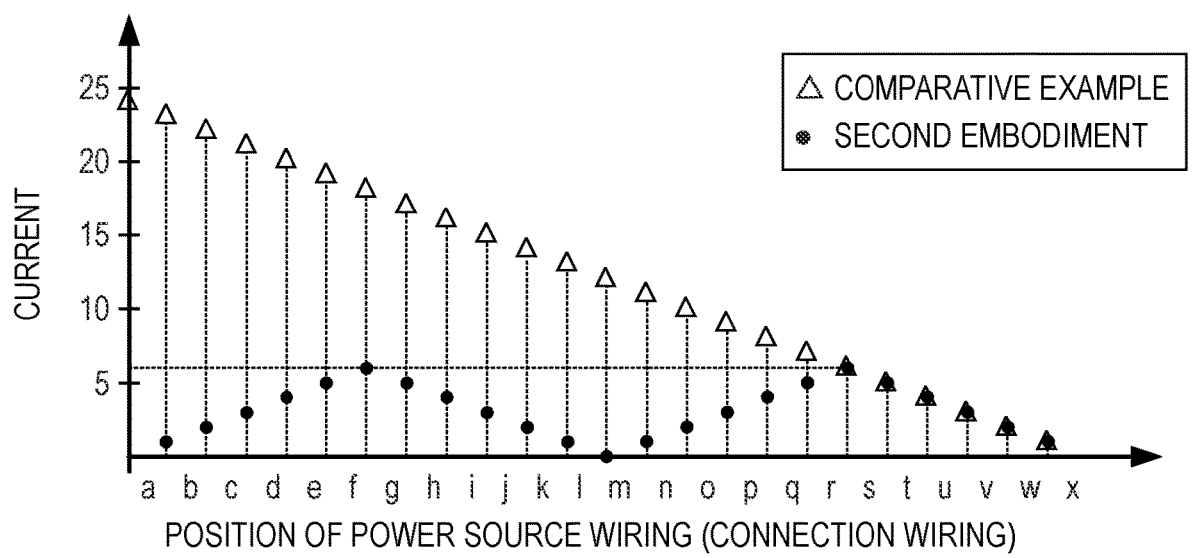
FIG. 7B is an explanatory diagram illustrating the arrangement of the first power supply sources according to the second embodiment.

FIG. 7B is a plot of the magnitude of the current flowing through the respective portions of the power source wiring 400, which is described with reference to the second embodiment in FIG. 7A and the comparative example in FIGS. 5A to 5C. The alphabets on the horizontal axis and the values on the vertical axis in FIG. 7B are the same as those in FIG. 6. It can be seen from this that the current flowing through the power source wiring 400 is at most 6Io [A] in the second embodiment, while the current flowing through the power source wiring 400 is at most 24Io [A] in the comparative example, which indicates that the effect of reducing the current is remarkably higher in the second embodiment. In this case, it is desirable that half of the total number of connection wirings be provided between the first power supply source 402a and the first power supply source 402b.

Third Embodiment

Figure 8A:
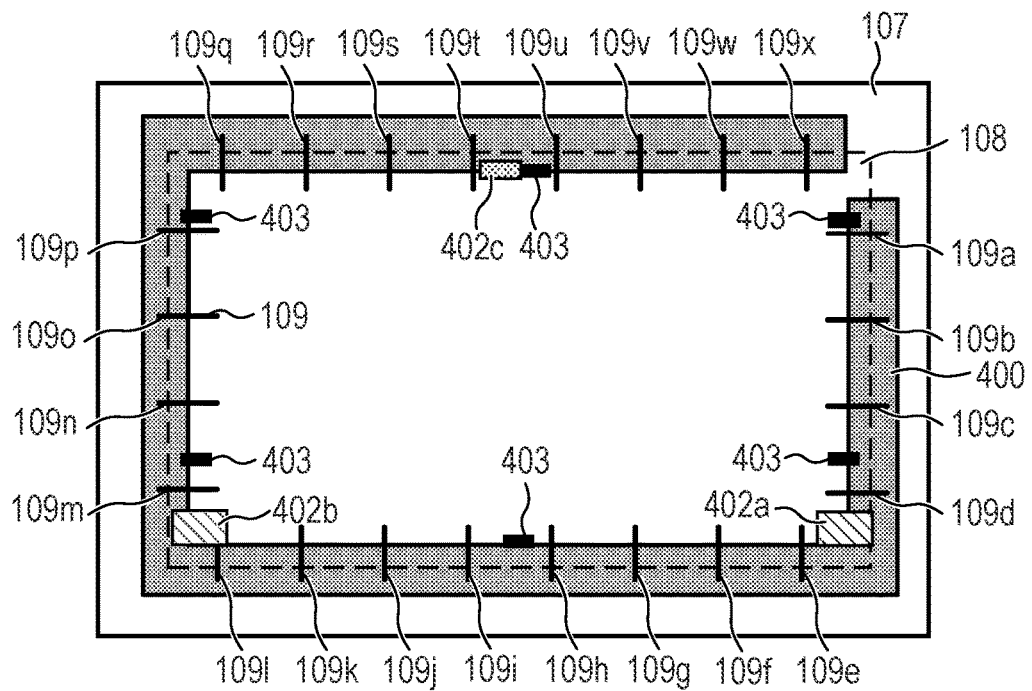
FIG. 8A is an explanatory diagram illustrating an arrangement of first power supply sources according to a third embodiment.

FIG. 8A is a top view illustrating the power supply sources that supply power to the power source wiring 400 and the imaging device 108 of the imaging apparatus according to a third embodiment. FIG. 8A illustrates three first power supply sources. In FIG. 8A, the first power supply source 402a is arranged between the connection wiring 109d and the connection wiring 109e, the first power supply source 402b is arranged between the connection wiring 109l and the connection wiring 109m, and a first power supply source 402c is arranged between the connection wiring 109t and the connection wiring 109u. Note that, also in the present embodiment, a discussion will be made assuming that the impedances of the first power supply sources 402a, 402b and 402c are equivalent. Therefore, each of the first power supply sources 402 supplies 1/3 of the current Io flowing through each of the connection wirings 109.

First, the power source wiring 400 between the first power supply source 402a and the connection wiring 109d is considered. A current supplied from the first power supply source 402a between them becomes a current 4×1/3Io=4/3Io [A], which is 1/3 of a current for four lines from the connection wiring 109a to the connection wiring 109d. Similarly, a current supplied from each of the first power supply sources 402b and 402c also amounts to 4/3Io [A], and as a result, a current (4/3+4/3+4/3)Io=4Io [A], which is the sum of these currents, flows through the power source wiring 400 between the first power supply source 402a and the connection wiring 109d.

Next, the power source wiring 400 between the first power supply source 402a and the connection wiring 109e is considered. First, the current supplied from the first power supply source 402a between them is 20/3Io [A], which is 1/3 of a current for 20 lines from the connection wiring 109e to the connection wiring 109x. A current supplied from the first power supply source 402b between them is 4/3Io [A], which is 1/3 of a current for four lines from the connection wiring 109a to the connection wiring 109d, which is in the opposite direction to the current supplied from the first power supply source 402a. Furthermore, a current supplied from the first power supply source 402c is also 4/3Io [A], which is 1/3 of the four lines from the connection wiring 109a to the connection wiring 109d, which is in the opposite direction to the current supplied from the first power supply source 402a. Therefore, a current of (20/3−4/3−4/3)Io=4Io [A] flows through the power source wiring 400 between the first power supply source 402a and the connection wiring 109e.

Figure 8B:
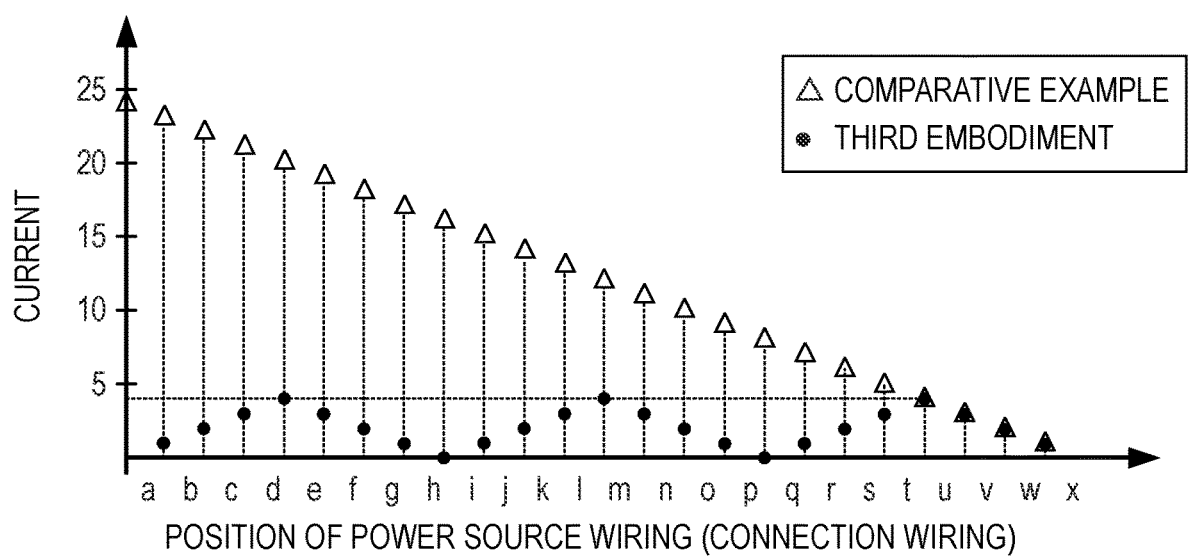
FIG. 8B is an explanatory diagram illustrating the arrangement of the first power supply sources according to the third embodiment.

The current distribution obtained by repeating the same discussion is illustrated in FIG. 8B. FIG. 8B is a plot of the magnitude of the current flowing through the respective portions of the power source wiring 400, which is described with reference to the third embodiment in FIG. 8A and the comparative example in FIGS. 5A to 5C. The alphabets on the horizontal axis and the values on the vertical axis in FIG. 8B are the same as those in FIG. 6. It can be seen from this that the current flowing through the power source wiring 400 is at most 4Io [A] in the third embodiment, while the current flowing through the power source wiring 400 is at most 24Io [A] in the comparative example, which indicates that the effect of reducing the current is remarkably higher in the third embodiment. In this case, when there are twenty-four connection wirings 109 and three first power supply sources 402, it is desirable that 24/3=8 connection wirings be provided between each of the first power supply sources 402.

Here, a case where the number of the connection wirings 109 is M and the number of the first power supply sources 402 is N is considered, and the natural number obtained by rounding off the value of M/(2N) with cutting off the value below the decimal point is denoted as X. Note that each of M and N is a natural number of two or more. Given that the ends of the power source wirings 400 may be defined, it is possible to provide X or (X+1) connection wirings 109 between each arbitrary end and the nearest first power supply source 402. Furthermore, it is desirable to provide 2×X or (2×X+1) connection wiring 109 between the respective first power supply sources 402. For example, a case where there are forty connection wirings 109 and six first power supply sources 402. In this case, the natural number X obtained by rounding off 40/(2×6) with cutting off the value below the decimal point is 3. Therefore, the first power supply source 402 is arranged at a position separated by three or four connection wirings 109 from one end of the power source wiring 400. In addition, another first power supply source 402 is similarly arranged at a position separated by three or four connection wirings 109 from another end. The remaining four first power supply sources 402 are arranged at positions with six or seven connecting wires 109 separating them from each other. This arrangement makes it possible to efficiently disperse the current.

Fourth Embodiment

Figure 9A:
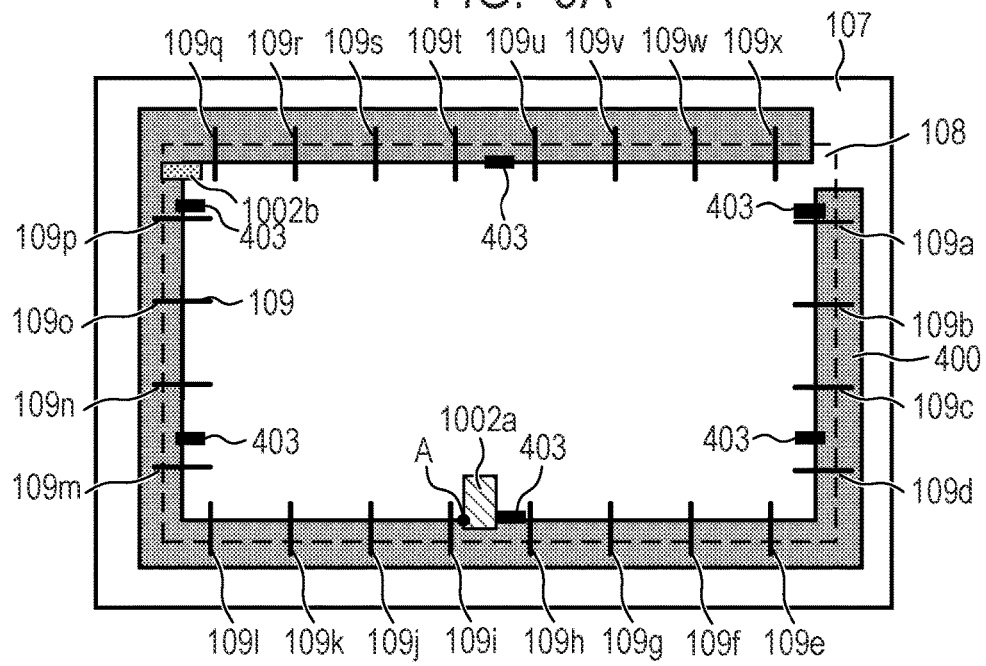
FIG. 9A is an explanatory diagram illustrating an arrangement of first power supply sources according to a fourth embodiment.

FIG. 9A is a top view illustrating the power supply sources that supply power to the power source wiring 400 and the imaging device 108 of the imaging apparatus according to a fourth embodiment. In the fourth embodiment, a case where a first power supply source 1002a and a first power supply source 1002b have different impedances is described. In the following description, a case where the impedance of the first power supply source 1002b is two times larger than that of the first power supply source 1002a will be described as an example. In this case, since the impedance ratio of them is 1:2, the first power supply source 1002a supplies 2/3Io [A] and the first power supply source 1002b supplies 1/3Io [A] of a current Io [A] supplied to each connection wiring 109.

Under this assumption, a current Io [A] supplied from the first power supply source 1002a and the first power supply source 1002b flows through the power source wiring 400 between the connection wiring 109a and the connection wiring 109b. Next, 2Io [A], which is the sum of currents supplied to the connection wiring 109a and the connection wiring 109b, flows through the power source wiring 400 between the connection wiring 109b and the connection wiring 109c. In the same way, 8Io [A], which is the sum of currents from the connection wiring 109a to the connection wiring 109h, flows through the power source wiring 400 between the first power supply source 1002a and the connection wiring 109h. Further in the same way, 8Io [A], which is the sum of currents from the connection wiring 109x to the connection wiring 109p, flows through the power source wiring 400 between the first power supply source 1002b and the connection wiring 109p.

Next, a current flowing through the power source wiring 400 between the first power supply source 1002a and the connection wiring 109i is considered. In this case, 2/3Io [A], which is the impedance ratio, is supplied from the first power supply source 1002a for currents of sixteen lines from the connection wiring 109i to the connection wiring 109x. That is, the amount of current supplied from the first power supply source 1002a to the left side of the point A is 16×2/3Io [A]. On the other hand, a current carried by the first power supply source 1002b is 8×1/3Io [A] in consideration of eight lines from the connection wiring 109a to the connection wiring 109h, that is, the impedance ratio. The point to note at this point is the direction of the respective currents, and the direction of the current supplied by the first power supply source 1002a and the current supplied by the first power supply source 1002b are opposite to each other. Therefore, (16×2/3−8×1/3)Io [A]=8Io [A], which is the difference in the current obtained so far, flows on the left side of the point A.

Figure 9B:
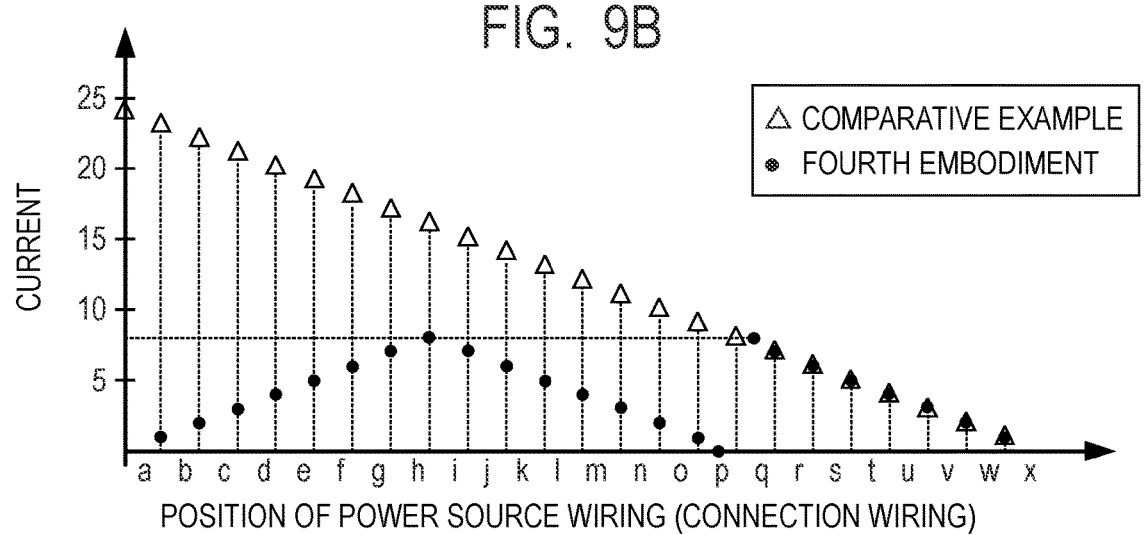
FIG. 9B is an explanatory diagram illustrating the arrangement of the first power supply source according to the fourth embodiment.

The result of performing the same calculation for each point is illustrated in FIG. 9B. FIG. 9B is a plot of the magnitude of the current flowing through the respective portion of the power source wiring 400, which is described with reference to the fourth embodiment in FIG. 9A and the comparative example in FIGS. 5A to 5C. The alphabet on the horizontal axis and the values on the vertical axis in FIG. 9B are the same as those in FIG. 6. As can be seen from this, the current flowing in the power source wiring 400 is reduced from 24Io [A] in the comparative example to 8Io [A] at most in the fourth embodiment, which indicates that the current flowing in the power source wiring 400 can be reduced.

Figure 10:
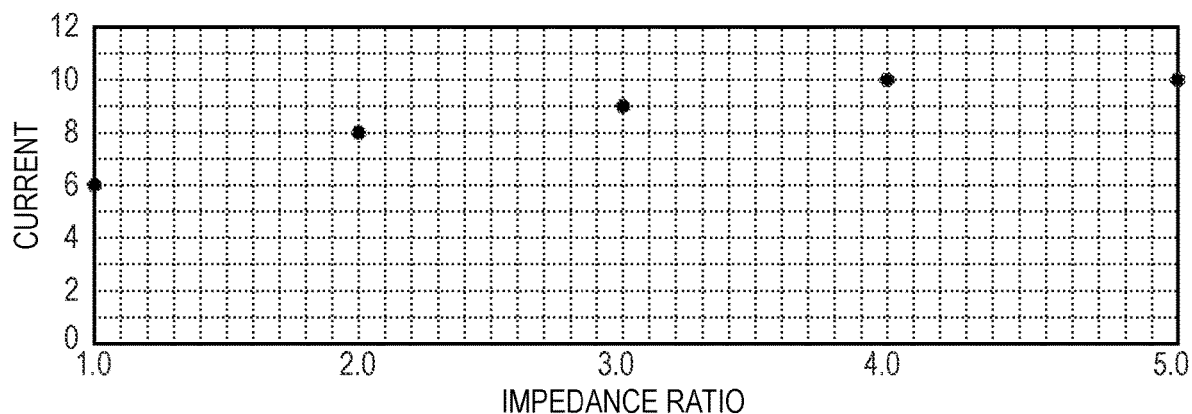
FIG. 10 is an explanatory diagram illustrating the resistance ratio of the first power supply sources according to the fourth embodiment and the magnitude of the current.

FIG. 10 is a plot of the current value flowing through the power source wiring 400 at each impedance ratio when the impedance ratio between the first power supply source 1002a and the first power supply source 1002b is changed. It can be seen from this that the effect of current dispersion can be obtained when the impedance ratio is up to about five times.

Fifth Embodiment

Figure 11A:
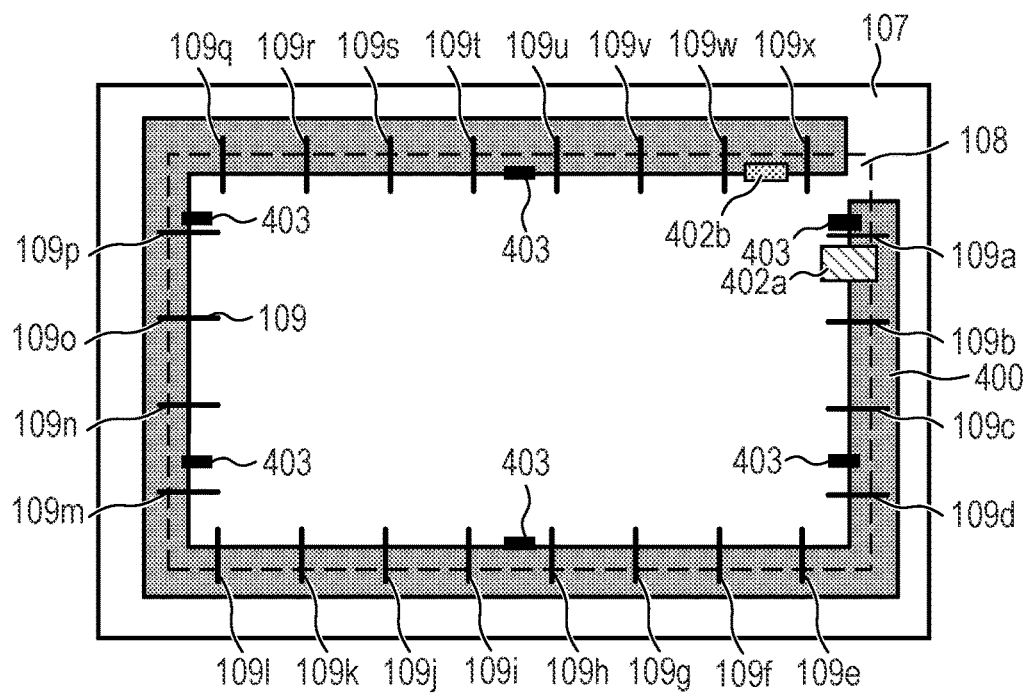
FIG. 11A is an explanatory diagram illustrating an arrangement of first power supply sources according to a fifth embodiment.

FIG. 11A is a top view illustrating the power supply sources that supply power to the power source wiring 400 and the imaging device 108 of the imaging apparatus according to a fifth embodiment. In FIG. 11A, the first power supply source 402a is arranged between the connection wiring 109a and the connection wiring 109b, and the first power supply source 402b is arranged between the connection wiring 109w and the connection wiring 109x. In this case also, the same discussion as in the previous embodiments will be carried out.

First, the power source wiring 400 between the first power supply source 402a and the connection wiring 109a is considered. A current supplied from the first power supply sources 402a and 402b is a current Io [A] supplied to the connection wiring 109a. Similarly, a current Io [A] flows through the power source wiring 400 between the first power supply source 402b and the connection wiring 109x by the same discussion.

Next, the power source wiring 400 between the first power supply source 402a and the connection wiring 109b is considered. First, 11.5Io [A], which is half of currents for twenty-three lines from the connection wiring 109b to the connection wiring 109x, flows by the first power supply source 402a. Next, 0.5Io [A], which is half of current for one line of the connection wiring 109a, flows by the first power supply source 402b. Since these currents are in opposite directions, a current (11.5−0.5)Io=11Io [A] flows through the power source wiring 400 between the first power supply source 402a and the connection wiring 109b. Similarly, a current 11Io [A] flows through the power source wiring 400 between the first power supply source 402b and the connection wiring 109w.

Figure 11B:
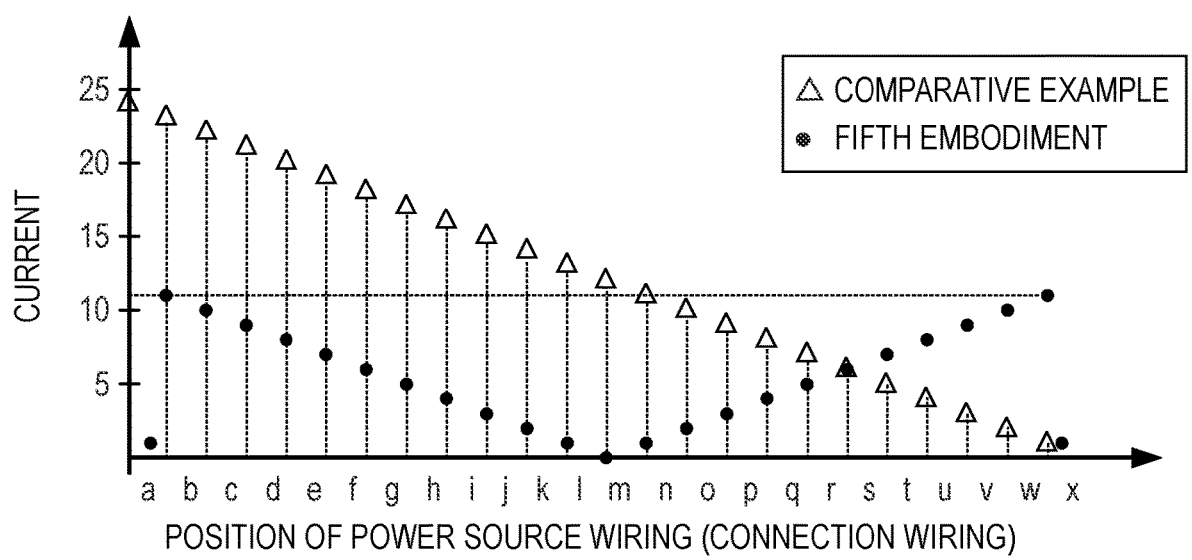
FIG. 11B is an explanatory diagram illustrating the arrangement of the first power supply sources according to the fifth embodiment.

When the same calculation is carried out between the respective connection wirings 109, the magnitude of the current flowing through the power source wirings 400 of each of the fifth embodiment and the comparative example becomes as illustrated in FIG. 11B. FIG. 11B is a plot of the magnitude of the current flowing through the respective portions of the power source wiring 400, which is described with reference to the fifth embodiment in FIG. 11A and the comparative example in FIGS. 5A to 5C. The alphabets on the horizontal axis and the values on the vertical axis in FIG. 11B are the same as those in FIG. 6. It can be seen from this that the current flowing through the power source wiring 400 is at most 11Io [A] in the fifth embodiment, while the current flowing through the power source wiring 400 is at most 24Io [A] in the comparative example, which indicates that the effect of dispersing the current is obtained.

Sixth Embodiment

Figure 12A:
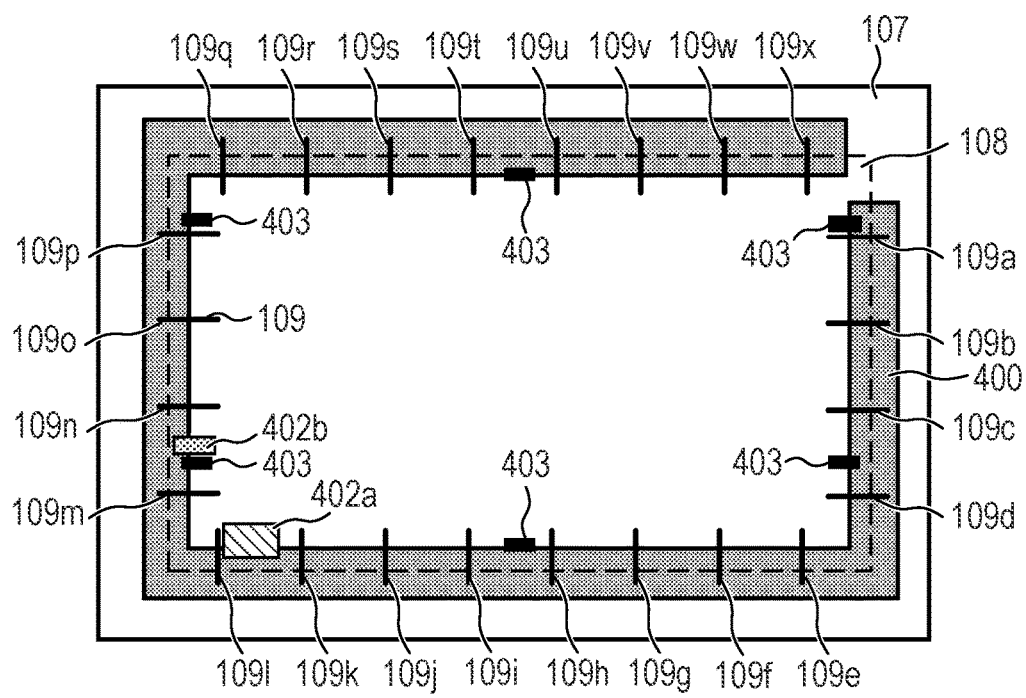
FIG. 12A is an explanatory diagram illustrating an arrangement of first power supply sources according to a sixth embodiment.

FIG. 12A is a top view illustrating the power supply sources that supply power to the power source wiring 400 and the imaging device 108 of the imaging apparatus according to a sixth embodiment. In FIG. 12A, the first power supply source 402a is arranged between the connection wiring 109k and the connection wiring 109l, and the first power supply source 402b is arranged between the connection wiring 109m and the connection wiring 109n. In this case also, the same discussion as in the previous embodiments will be carried out.

First, a current Io [A] required by the connection wiring 109a flows through the power source wiring 400 between the connection wirings 109a and 109b as a current supplied from the first power supply sources 402a and 402b. By the same discussion, a current Io [A] also flows through the power source wiring 400 between the connection wiring 109w and the connection wiring 109x. Between the connection wiring 109b and the connection wiring 109c, the current of the connection wiring 109a and the current of the connection wiring 109b are added, and a current of 2Io [A] flows. Similarly, 2Io [A] flows between the connection wiring 109v and the connection wiring 109w. When this is repeated, a current 11Io [A] for eleven lines from the connection wiring 109a to the connection wiring 109k flows through the power source wiring 400 between the first power supply source 402a and the connection wiring 109k. Similarly, a current 11Io [A] for eleven lines from the connection wiring 109n to the connection wiring 109x also flows through the power source wiring 400 between the first power supply source 402b and the connection wiring 109n.

Next, the power source wiring 400 between the first power supply source 402a and the connection wiring 109l is considered. First, 6.5Io [A], which is half of current 13Io [A] supplied to from the connection wiring 109l to the connection wiring 109x, flows from the first power supply source 402a. On the other hand, a current 5.5Io [A], which is half of the current for eleven lines that is supplied to from the connection wiring 109a to the connection wiring 109k, flows from the first power supply source 402b. Since these currents have opposite directions, a current (6.5−5.5)Io=1Io [A] flows through the power source wiring 400 between the first power supply source 402a and the connection wiring 109l. Similarly, a current 1Io [A] also flows through the power source wiring 400 between the first power supply source 402b and the connection wiring 109m.

Figure 12B:
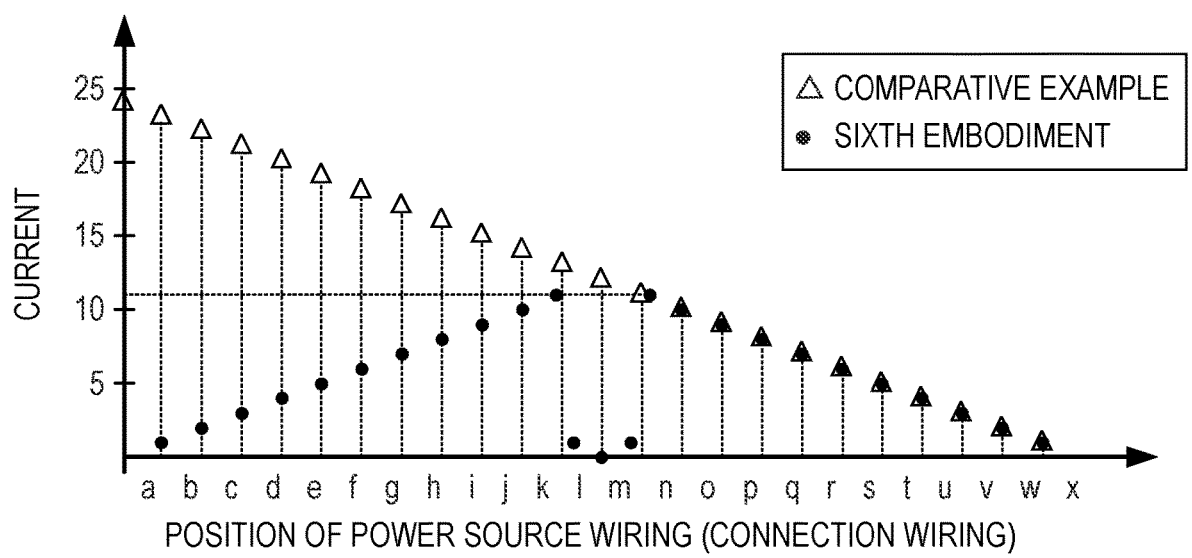
FIG. 12B is an explanatory diagram illustrating the arrangement of the first power supply sources according to the sixth embodiment.

When the same calculation is carried out between the respective connection wirings 109, the magnitude of the current flowing through the power source wirings 400 of each of the sixth embodiment and the comparative example becomes as illustrated in FIG. 12B. FIG. 12B is a plot of the magnitude of the current flowing through the respective portions of the power source wiring 400, which is described with reference to the sixth embodiment in FIG. 12A and the comparative example in FIGS. 5A to 5C. The alphabets on the horizontal axis and the values on the vertical axis in FIG. 12B are the same as those in FIG. 6. It can be seen from this that the current flowing through the power source wiring 400 is at most 11Io [A] in the sixth embodiment, while the current flowing through the power source wiring 400 is at most 24Io [A] in the comparative example, which indicates that the effect of dispersing the current is obtained.

The embodiments described herein may be modified as appropriate to the extent that they do not depart from the technical concept. For example, multiple embodiments may be combined. In addition, a matter or matters of at least one embodiment can be deleted or replaced. Further, a matter or matters can be newly added to at least one embodiment. The disclosure of the present specification includes not only what is explicitly described herein, but also all that is ascertainable from the present specification and the drawings attached hereto. For example, any combination of each of the described matters is also a part of the disclosure in the present specification. For example, if there are a description "A is equal to or greater than B" and a description "C is equal to or less than D", the embodiment "A is equal to or greater than B and C is equal to or less than D" is the disclosure in the present specification. In the present specification, "A is equal to or greater than B" (A is an arbitrary element and B is an arbitrary index) means "A is equal to B or A is greater than B". "C is equal to or less than D (C is an arbitrary element and D is an arbitrary index) means "C is equal to D or C is less than D (under or below D)". Further, the disclosure in the present specification includes a complement set for each of the individual concepts described in the present specification. That is, if it is described in the present specification that "E is F" (E and F are arbitrary matters), the present specification discloses a case where "E is not F" even though a description for the case where "E is not F" is omitted. This is because, when it is described that "E is F", it is assumed that the case where "E is not F" is considered.

According to the present invention, it is possible to provide an advantageous technique for reducing image noise in an imaging apparatus and an electronic equipment.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2021-163075, filed Oct. 1, 2021, which is hereby incorporated by reference herein in its entirety.

What is claimed is:

1. An imaging apparatus comprising:
an imaging device in which a plurality of photoelectric conversion elements are arranged in an array;
a wiring component in which the imaging device is mounted and a power source wiring is provided;
a plurality of connection wirings that connects the power source wiring and the imaging device each other;
at least two power supply sources connected to the power source wiring; and
at least one power supply source connected to the power source wiring,
wherein the two power supply sources and the one power supply source supply power to the imaging device via the power source wiring and the plurality of connection wirings, wherein, at a horizontal synchronization frequency of the imaging device, the two power supply sources have lower impedances than the one power supply source, and wherein at least one connection wiring of the plurality of connection wirings is connected to a wiring path connecting the two power supply sources in the power source wiring.

2. The imaging apparatus according to claim 1, wherein the two power supply sources are capacitors having the same standard capacitance values as each other.

3. The imaging apparatus according to claim 1, wherein one of the two power supply sources is an integrated circuit and another of the two power supply sources is a capacitor.

4. The imaging apparatus according to claim 1, wherein one of the two power supply sources is a regulator.

5. The imaging apparatus according to claim 1, wherein a horizontal synchronization frequency of the imaging device is 20 kHz to 200 kHz.

6. The imaging apparatus according to claim 1, wherein the two power supply sources have an impedance ratio within five times.

7. The imaging apparatus according to claim 1, wherein, in a case where the number of the plurality of connection wirings is M and the number of a plurality of power supply sources including not the at least one power supply source but the at least two power supply sources is N, and a natural number obtained by rounding off a value, which is obtained by dividing M by 2N, with cutting off a value below a decimal point is X, X or (X+1) of the connection wirings are provided between an arbitrary end of the power source wiring and the power supply source nearest from the arbitrary end of the power source wiring out of the N power supply sources, and 2×X or (2×X+1) of the connection wirings are provided between each of the N power supply sources.

8. The imaging apparatus according to claim 1, wherein the number of the plurality of connection wires is twelve or more, and the number of the two power supply sources connected to the power supply wires is six or more.

9. The imaging apparatus according to claim 1, wherein the two power supply sources are mounted on the wiring component.

10. The imaging apparatus according to claim 1, wherein the plurality of connection wires are bonding wires.

11. The imaging apparatus according to claim 1, wherein the two power supply sources include at least one of a capacitive component and an inductive component.

12. The imaging apparatus according to claim 1, wherein impedances of the two power supply sources are frequency dependent.

13. The imaging apparatus according to claim 1, wherein the power source wiring has a non-closed loop shape along each of four sides of the quadrilateral imaging device.

14. The imaging apparatus according to claim 1, wherein the power source wiring does not overlap an area of 90% or more of an imaging region of the imaging device.

15. The imaging apparatus according to claim 1, wherein the imaging device includes: a first semiconductor layer having the plurality of photoelectric conversion elements; a second semiconductor layer stacked over the first semiconductor layer and having an integrated circuit; and a wiring layer positioned between the first semiconductor layer and the second semiconductor layer.

16. The imaging apparatus according to claim 1, wherein an area of an imaging region of the imaging device is 200 mm$^2$ or more, 300 mm$^2$ or more, or 800 mm$^2$ or more.

17. The imaging apparatus according to claim 1, wherein at least one of the two power supply sources has a portion that does not overlap the imaging device.

18. The imaging apparatus according to claim 1, wherein the imaging device has a quadrilateral shape including a first side and a second side, and a third side and a fourth side both of which are shorter than the first side and the second side, and wherein at least one of the two power supply sources is arranged closer to the first side or the second side than the third side and the fourth side.

19. An electronic equipment comprising the imaging apparatus according to claim 1, the electronic equipment comprising at least one of:

a processing apparatus that processes a signal outputted from the imaging apparatus; and a display device that displays an image imaged by the imaging device.

20. An electronic equipment comprising:

the imaging apparatus according to claim 1; and a driving device that moves the imaging apparatus.

21. An imaging apparatus comprising:

an imaging device in which a plurality of photoelectric conversion elements are arranged in an array;

a wiring component in which the imaging device is mounted and a power source wiring is provided;

a plurality of connection wirings that connects the power source wiring and the imaging device each other; and at least two power supply sources connected to the power source wiring, wherein the two power supply sources supply power to the imaging device via the power source wiring and the plurality of connection wirings, wherein, at a frequency from 20 kHz to 200 kHz, the two power supply sources have an impedance of 5 [Ω] or less, and wherein at least one connection wiring of the plurality of connection wirings is connected to a wiring path connecting the two power supply sources in the power source wiring.

22. An electronic equipment comprising:

the imaging apparatus according to claim 21; and a driving device that moves the imaging apparatus.

* * * * *